(12) United States Patent
Choi et al.

(10) Patent No.: US 12,206,056 B2
(45) Date of Patent: Jan. 21, 2025

(54) SEMICONDUCTOR PACKAGE WITH INTERMETALLIC-COMPOUND SOLDER-JOINT COMPRISING SOLDER, UBM, AND REDUCING LAYER MATERIALS

(71) Applicant: ELECTRONICS AND TELECOMMUNICATIONS RESEARCH INSTITUTE, Daejeon (KR)

(72) Inventors: Kwang-Seong Choi, Daejeon (KR); Yong Sung Eom, Daejeon (KR); Jiho Joo, Daejeon (KR); Gwang-Mun Choi, Daejeon (KR); Seok-Hwan Moon, Daejeon (KR); Chanmi Lee, Daejeon (KR); Ki Seok Jang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 688 days.

(21) Appl. No.: 17/399,754

(22) Filed: Aug. 11, 2021

(65) Prior Publication Data
US 2022/0102603 A1    Mar. 31, 2022

(30) Foreign Application Priority Data

Sep. 28, 2020  (KR) .................. 10-2020-0126348
Jun. 16, 2021  (KR) .................. 10-2021-0077893

(51) Int. Cl.
*H01L 33/62*    (2010.01)
*H01L 23/00*    (2006.01)

(52) U.S. Cl.
CPC .............. *H01L 33/62* (2013.01); *H01L 24/05* (2013.01); *H01L 24/13* (2013.01); *H01L 24/81* (2013.01);
(Continued)

(58) Field of Classification Search
CPC ......... H01L 24/05; H01L 24/13; H01L 24/81; H01L 2224/0401; H01L 2224/05124;
(Continued)

(56) References Cited

U.S. PATENT DOCUMENTS 5,895,620 A   4/1999  Pas et al.
8,211,745 B2  7/2012  Eom et al.
(Continued)

FOREIGN PATENT DOCUMENTS

KR    960026681 A     7/1996
KR    20110041181 A   4/2011
(Continued)

OTHER PUBLICATIONS

Jung-Hun Seo et al., "A Simplified Method of Making Flexible Blue LEDs on a Plastic Substrate", IEEE Photonics Journal, vol. 7, No. 2, Apr. 2015.
(Continued)

*Primary Examiner* — Marcos D. Pizarro
(74) *Attorney, Agent, or Firm* — Rabin & Berdo, P.C.

(57) ABSTRACT

Provided is a method of fabricating a semiconductor package. The method of fabricating the semiconductor package include preparing a lower element including a lower substrate, a lower electrode, an UBM layer, and a reducing agent layer, providing an upper element including an upper substrate, an upper electrode, and a solder bump layer, providing a pressing member on the upper substrate to press the upper substrate to the lower substrate, and providing a laser beam passing through the pressing member to bond the upper element to the lower element.

20 Claims, 16 Drawing Sheets

(52) U.S. Cl.
CPC .......... *H01L 2224/0401* (2013.01); *H01L 2224/0508* (2013.01); *H01L 2224/05082* (2013.01); *H01L 2224/05083* (2013.01); *H01L 2224/05084* (2013.01); *H01L 2224/05124* (2013.01); *H01L 2224/05144* (2013.01); *H01L 2224/05147* (2013.01); *H01L 2224/05155* (2013.01); *H01L 2224/05171* (2013.01); *H01L 2224/05184* (2013.01); *H01L 2224/0519* (2013.01); *H01L 2224/13026* (2013.01); *H01L 2224/1308* (2013.01); *H01L 2224/13082* (2013.01); *H01L 2224/13083* (2013.01); *H01L 2224/13084* (2013.01); *H01L 2224/1319* (2013.01); *H01L 2224/13193* (2013.01); *H01L 2224/13209* (2013.01); *H01L 2224/13211* (2013.01); *H01L 2224/13213* (2013.01); *H01L 2224/13239* (2013.01); *H01L 2224/13244* (2013.01); *H01L 2224/13247* (2013.01); *H01L 2224/13255* (2013.01); *H01L 2224/13561* (2013.01); *H01L 2224/13562* (2013.01); *H01L 2224/1357* (2013.01); *H01L 2224/1369* (2013.01); *H01L 2224/81011* (2013.01); *H01L 2224/8102* (2013.01); *H01L 2224/81193* (2013.01); *H01L 2224/81203* (2013.01); *H01L 2224/81224* (2013.01); *H01L 2224/81355* (2013.01); *H01L 2224/8181* (2013.01); *H01L 2924/01029* (2013.01); *H01L 2924/01047* (2013.01); *H01L 2924/01049* (2013.01); *H01L 2924/0105* (2013.01); *H01L 2924/01079* (2013.01); *H01L 2924/01083* (2013.01); *H01L 2924/014* (2013.01); *H01L 2924/12041* (2013.01); *H01L 2933/0066* (2013.01)

(58) Field of Classification Search
CPC . H01L 2224/05144; H01L 2224/05147; H01L 2224/05155; H01L 2224/05171; H01L 2224/05184; H01L 2224/0508–05084; H01L 2224/0519; H01L 2224/13561; H01L 2224/13562; H01L 2224/1357; H01L 2224/1369; H01L 2224/8102; H01L 2224/81224; H01L 2224/81355; H01L 2224/8181; H01L 2924/014; H01L 2924/1461

See application file for complete search history.

(56) References Cited

U.S. PATENT DOCUMENTS

| | | | |
|---|---|---|---|
| 10,714,464 | B2 | 7/2020 | Pokhriyal et al. |
| 2009/0311810 | A1 | 12/2009 | Yang et al. |
| 2011/0260179 | A1 | 10/2011 | Hung |
| 2017/0141071 | A1* | 5/2017 | Choi .............. H01L 24/81 |
| 2019/0279958 | A1* | 9/2019 | Chen .............. H01L 23/3114 |
| 2020/0266078 | A1 | 8/2020 | Eom et al. |
| 2020/0395332 | A1* | 12/2020 | Lakhera ............ H01L 23/66 |
| 2022/0005778 | A1* | 1/2022 | Lee ................ H01L 24/40 |
| 2022/0020722 | A1* | 1/2022 | Homma ............ H01L 24/81 |

FOREIGN PATENT DOCUMENTS

| | | |
|---|---|---|
| KR | 10-1703561 B1 | 2/2017 |
| KR | 10-2019-0116235 A | 10/2019 |
| KR | 20200027399 A | 3/2020 |
| KR | 10-2020-0102350 A | 8/2020 |

OTHER PUBLICATIONS

Won-Sik Choi et al., "Flexible InGaN LEDs on a Polyimide Substrate Fabricated Using a Simple Direct-Transfer Method", IEEE Photonics Technology Letters, vol. 26, No. 21, pp. 2115-2117, Nov. 1, 2014.

Yoon-Chul Sohn et al., "Wafer-level low temperature bonding with Au—In system", 2007 Electronic Components and Technology Conference, IEEE, pp. 633-637, May 29-Jun. 1, 2007.

* cited by examiner

SEMICONDUCTOR PACKAGE WITH INTERMETALLIC-COMPOUND SOLDER-JOINT COMPRISING SOLDER, UBM, AND REDUCING LAYER MATERIALS

CROSS-REFERENCE TO RELATED APPLICATIONS

This U.S. non-provisional patent application claims priority under 35 U.S.C. § 119 of Korean Patent Application Nos. 10-2020-0126348, filed on Sep. 28, 2020, and 10-2021-0077893, filed on Jun. 16, 2021, the entire contents of which are hereby incorporated by reference.

BACKGROUND

The present disclosure herein relates to a method of fabricating a semiconductor package, and more particularly, to a method of fabricating a semiconductor package, which includes a bonding process using a laser beam.

Recently, with the development of information technology, various types of semiconductor packages are being developed. Semiconductor packages may include silicon/compound elements, MEMS/sensors, RF/analog elements, power semiconductor elements, and LED/display elements. A general method of fabricating a semiconductor package may include a heat pression process. However, the general heat pression process may have a disadvantage of increasing in thermal stress due to a difference in thermal expansion coefficient between a lower element and an upper element.

SUMMARY

The present disclosure provides a method of fabricating a semiconductor package that is minimized in thermal stress.

The object of the present disclosure is not limited to the aforesaid, but other objects not described herein will be clearly understood by those skilled in the art from descriptions below.

An embodiment of the inventive concept provides a method of fabricating a semiconductor package. The method of fabricating the semiconductor package includes: preparing a lower element including a lower substrate, a lower electrode on the lower substrate, an under bump metallurgy (UBM) layer on the lower electrode, and a reducing agent layer on the UBM layer; providing an upper element including an upper substrate, an upper electrode on the upper substrate, and a solder bump layer on the upper electrode; providing a pressing member on the upper substrate to press the upper substrate to the lower substrate; and providing a laser beam passing through the pressing member to the upper substrate to form the UBM layer, the reducing agent layer, and the solder bump layer as an intermetallic compound layer by using conductive heat of the upper substrate and the upper electrode.

In an embodiment, the lower element may further include: a curing agent layer between the UBM layer and the reducing agent layer; and a base material layer between the curing agent layer and the reducing agent layer.

In an embodiment, the curing agent layer and the base material layer may be formed as a protective layer around the intermetallic compound layer.

In an embodiment, the method may further include dipping the lower element and the upper element in DI (deionized) water through which the laser beam is transmitted. In an embodiment, the DI water may allow the protective layer to be formed around the lower electrode and the upper electrode.

In an embodiment, the method may further include bubbling the DI water.

In an embodiment, the method may further include removing the DI water to dry the lower element and the upper element.

In an embodiment, the curing agent layer may include aliphatic amine, and the base material layer may include epoxy.

In an embodiment, the lower element may further include an absorption layer between the UBM layer and the reducing agent layer.

In an embodiment, the absorption layer may include: a plate-shaped absorber; and metal powder bonded to the plate-shaped absorber.

In an embodiment, the plate-shaped absorber may include graphene.

In an embodiment, the metal powder may include nickel or copper.

In an embodiment, the lower substrate may further include partition walls outside the upper element.

In an embodiment, the method may further include providing a polymer film between the pressing member and each of the partition walls and between the pressing member and the upper substrate.

In an embodiment, the polymer film may be transparent and have a convex shape in a downward direction.

In an embodiment, the polymer film may include polymethylmethacrylate (PMMA), polycarbonate, or polyimide.

In an embodiment, the method may further include providing an elastic member between the pressing member and each of the partition walls and between the pressing member and the upper substrate. In an embodiment, the elastic member may include polydimethylsiloxane (PDMS), silicon, or silica.

In an embodiment, the UBM layer may include nickel, copper, and an alloy of nickel-copper.

In an embodiment, the reducing agent layer may include hydrates of carboxylic hydrate, hydroxyl hydrate, and phenolic hydrate.

In an embodiment, the solder bump layer may include solders of tin (Sn), indium (In), tin bismuth (SnBi), tin silver copper (SnAgCu), tin silver (SnAg), gold tin (AuSn), indium tin (InSn), and bismuth indium tin (BiInSn).

In an embodiment, the lower substrate may include a light emitting element, and the upper substrate may include a lead.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
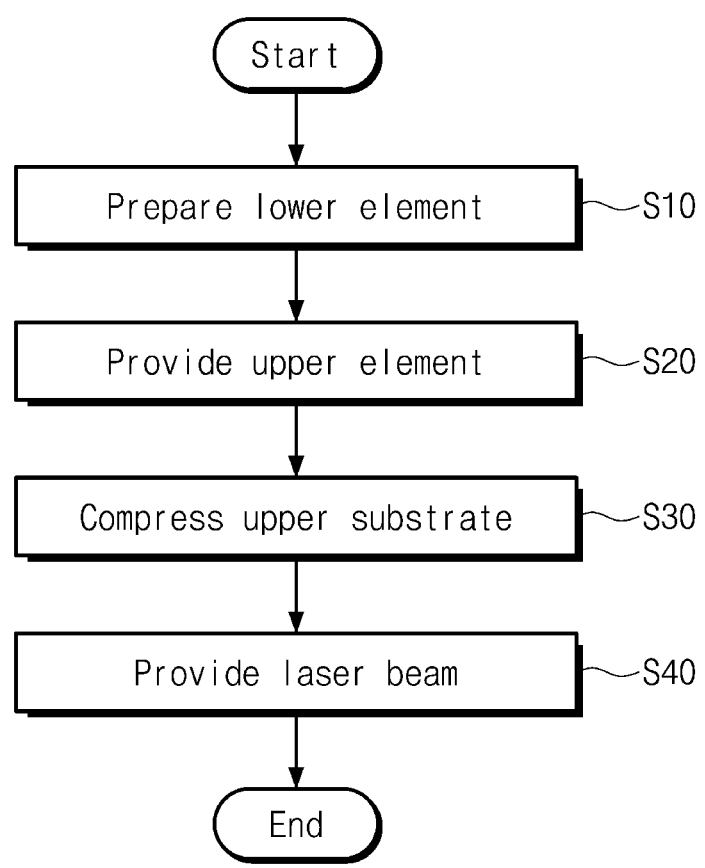
FIG. 1 is a flowchart illustrating a method of fabricating a package according to the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the present invention. In this specification, the terms of a singular form may include plural forms unless specifically mentioned. The meaning of 'comprises' and/or 'comprising' specifies a component, a step, an operation and/or an element does not exclude other components, steps, operations and/or elements.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Bonding, exposure, and compounds may be techniques widely disclosed in the fields of semiconductors. Thus, regions illustrated in the figures have schematic properties, and shapes of the regions illustrated in the figures exemplify specific forms of the regions of elements and are not intended to limit the scope of the invention.

FIG. 1 is a view illustrating a method of fabricating a semiconductor package according to the inventive concept.

Figure 2:
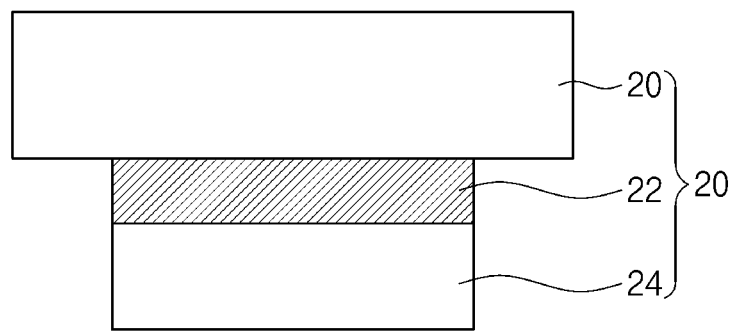
FIGS. 2 to 4 are process cross-sectional views illustrating the method of fabricating the package of FIG. 1.
Figure 2:
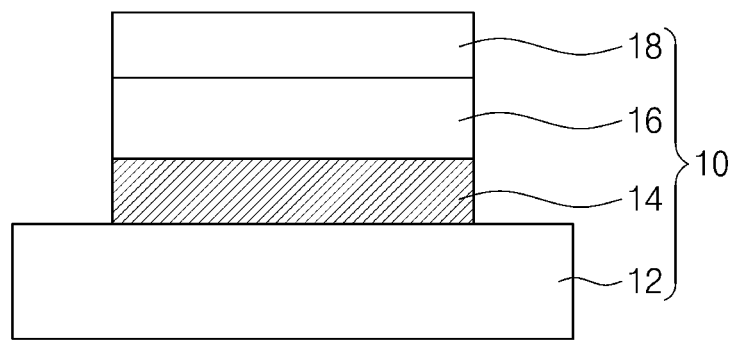
Figure 3:
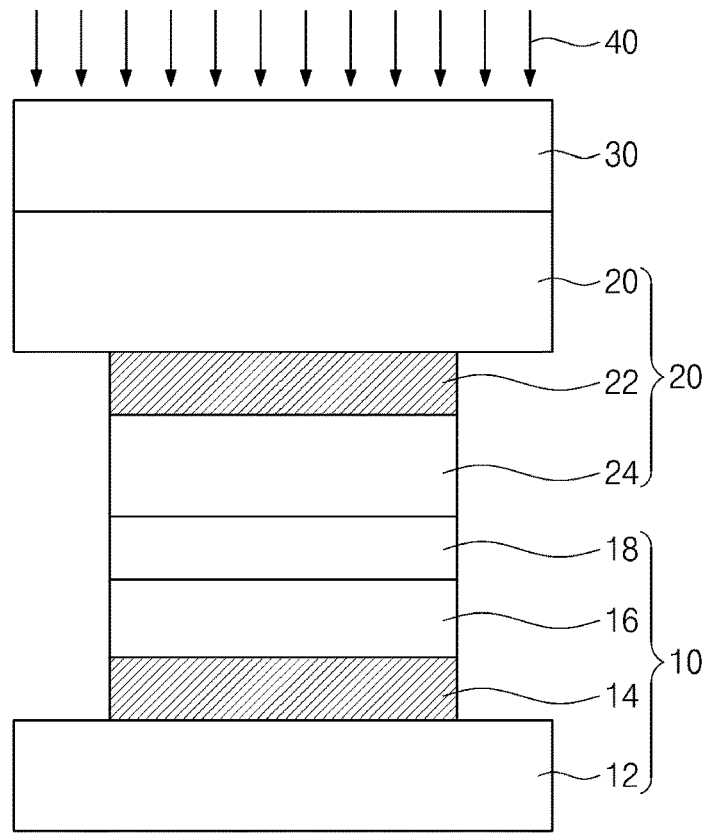
Figure 4:
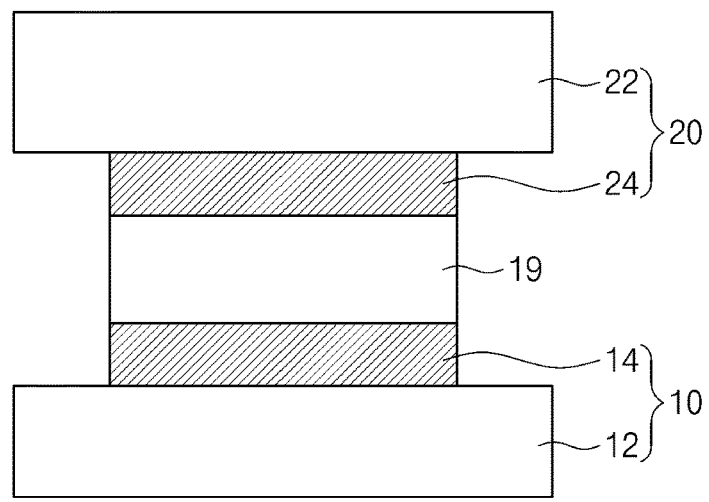

FIGS. 2 to 4 are process cross-sectional views illustrating the method of fabricating the semiconductor package of FIG. 1.

Referring to FIGS. 1 and 2, a lower element 10 is provided (S10). The lower element 10 may be a bottom device. The lower element 10 may include a lower substrate 12, a lower electrode 14, an under bump metallurgy (UBM) layer 16, and a reducing agent layer 18. The lower substrate 12 may include a semiconductor chip or a printed circuit board. The lower electrode 14 may be provided on the lower substrate 12. For example, the lower electrode 14 may include at least one of gold (Au), copper (Cu), aluminum (Al), or tungsten (W). The UBM layer 16 may be provided on the lower electrode 14. The UBM layer 16 may include chromium (Cr), copper (Cu), and an alloy of chromium-copper (Cr—Cu). Alternatively, the UBM layer 16 may include nickel (Ni), copper (Cu), or an alloy of nickel-copper (Ni—Cu), but the present disclosure is not limited thereto. The reducing agent layer 18 may be provided on the UBM layer 16. The reducing agent layer 18 may include hydroxyl or carboxylic acid, which is substituted with bulky groups (phenyl, phenol, sulfone, sulfide, etc.). For example, the reducing agent layer 18 may include hydrates of carboxylic hydrate, hydroxyl hydrate, and phenolic hydrate.

Next, the upper element 20 is provided on the lower element 10 (S20). The upper element 20 may be a top device. The upper element 20 may include an upper substrate 22, an upper electrode 24, and a solder bump layer 26. The upper substrate 22 may include a semiconductor chip or a printed circuit board, but the present disclosure is not limited thereto. The upper electrode 24 may be provided on a bottom surface of the upper substrate 22. The upper electrode 24 may be provided to correspond to the lower electrode 14. The upper electrode 24 may include the same material as that of the lower electrode 14. For example, the upper electrode 24 may include at least one of gold (Au), copper (Cu), aluminum (Al), or tungsten (W). The solder bump layer 26 may be provided on the lower electrode 14, the UBM layer 16, and the reducing agent layer 18. For example, the solder bump layer 26 may include solders of tin (Sn), indium (In), tin bismuth (SnBi), tin silver copper (SnAgCu), tin silver (SnAg), gold tin (AuSn), indium tin (InSn), and bismuth indium tin (BiInSn), but the present disclosure is not limited thereto. The solder bump layer 26 may be provided on the reducing agent layer 18.

Referring to FIGS. 1 and 3, a pressing member 30 is provided on the upper substrate 22 to press the upper substrate 22 (S30). The pressing member 30 may include a transparent block made of quartz or glass. The pressing member 30 may press the upper substrate 22 to the lower substrate 12.

Referring to FIGS. 1, 3 and 4, a laser beam 40 is applied to the upper element 20 to bond the upper element 20 to the lower element 10 (S40). The laser beam 40 may pass through the pressing member 30. The laser beam 40 may be, for example, a helium-neon laser beam, an argon laser beam, a UV laser beam, an IR laser beam, or an excimer laser beam. The laser beam 40 may have a wavelength of about 500 nm to about 2 μm. The laser beam 40 may be absorbed to the upper element 20 to heat the upper element 20. The laser beam 40 may heat the upper element 20 to bond the upper element 20 to the lower element 10. The laser beam 40 may heat the upper substrate 22 at a temperature of about 230° C. to about 370° C. The temperature of the upper substrate 22 may vary depending on an irradiation amount of the laser beam 40 and/or an irradiation intensity of the laser beam 40. The upper substrate 22 and the upper electrode 24 may absorb the laser beam 40 to transfer conduct heat to the upper electrode 24, the solder bump layer 26, the reducing agent layer 18, and the UBM layer 16. The solder bump layer 26, the reducing agent layer 18, and the UBM layer 16 may be melted by the conductive heat to form an intermetallic compound layer 19. The intermetallic compound layer 19 may bond the upper electrode 24 to the lower electrode 14. The reducing agent layer 18 may remove native oxide films of the lower electrode 14, the UBM layer 16, the solder bump layer 26, and the upper electrode 24. Thus, the UBM layer 16 and the solder bump layer 26 are melted by the conduction heat to form the intermetallic compound layer 19, thereby minimizing thermal stress due to a difference in thermal expansion coefficient between the lower element 10 and the upper element 20.

Although not shown, an underfill resin layer may be formed between the lower electrode 14, the intermetallic compound layer 19, the lower substrate 12 outside the upper electrode 24, and the upper substrate 22. The underfill resin layer may include a non-conductive film (NCF) or a non-conductive paste (NCP).

Figure 5:
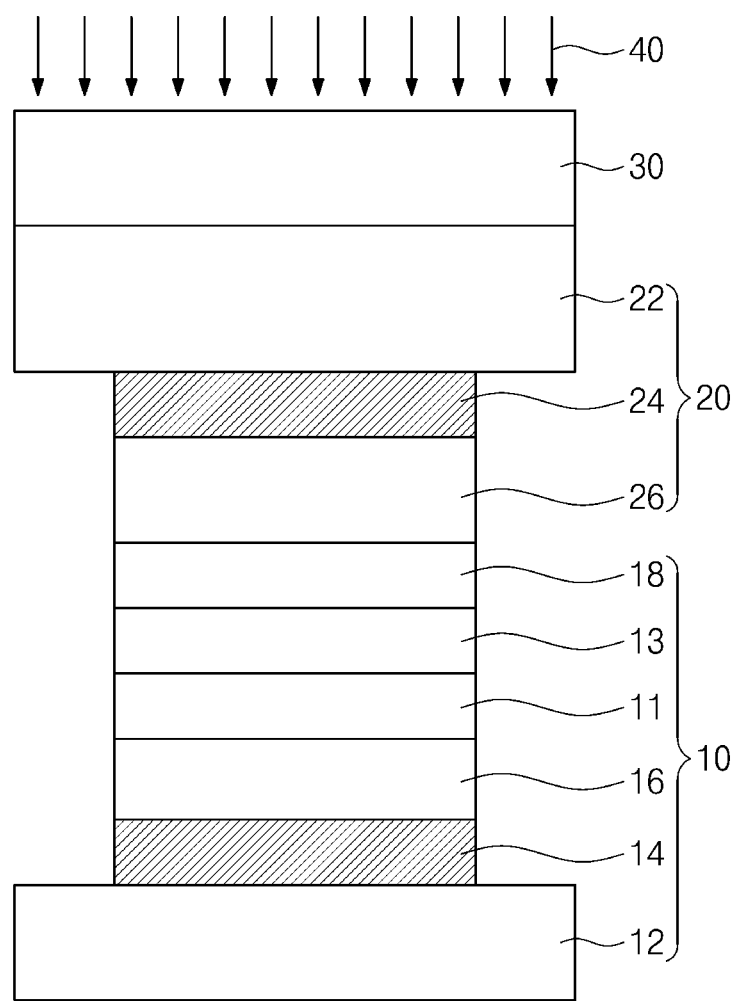
FIGS. 5 and 6 are process cross-sectional views illustrating examples in a method of fabricating a semiconductor package according to the inventive concept.
Figure 6:
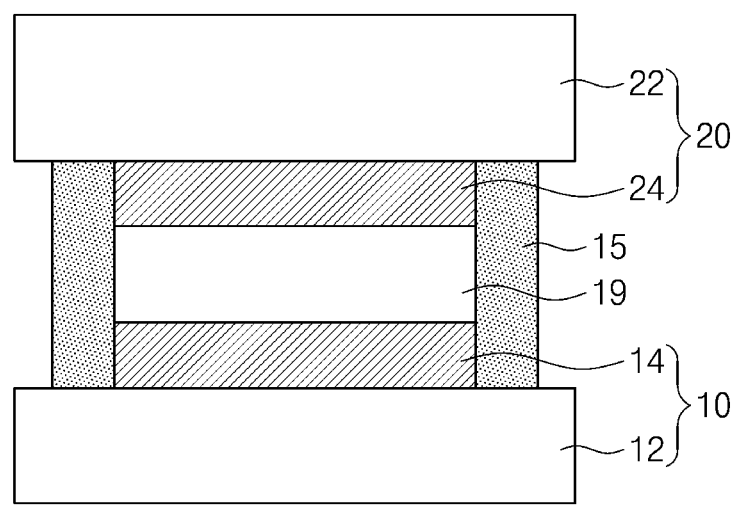

FIGS. 5 and 6 are process cross-sectional views illustrating examples in the method of fabricating a semiconductor package according to the inventive concept.

Referring to FIG. 5, the lower element 10 may further include a curing agent layer 11 and a base material layer 13. The curing agent layer 11 and the base material layer 13 may be provided between the UBM layer 16 and the reducing agent layer 18. The curing agent layer 11 may be provided between the UBM layer 16 and the base material layer 13. The curing agent layer 11 may include aliphatic amine, aromatic amine, cycloaliphatic amine, phenalkamine, imidazole, carboxylic acid, anhydride, polyamide-based hardners, phenolic curing agents, or waterborne curing agents. The base material layer 13 may be provided between the curing agent layer 11 and the reducing agent layer 18. The base material layer 13 may include a thermosetting resin. For example, the base material layer 13 may include epoxy, phenoxy, bismaleimide, unsaturated polyester, urethane, urea, phenol-formaldehyde, vulcanized rubber, a melamine resin, polyimide, an epoxy novolac resin, or cyanate ester.

Referring to FIG. 6, when the laser beam 40 is provided to the upper substrate 22 (S40), the curing agent layer 11 and the base material layer 13 may be heated by the laser beam 40 to form a protective layer 15. The protective layer 15 may be formed on sidewalls of the lower electrode 14, the intermetallic compound layer 19, and the upper electrode 24. The protective layer 15 may surround the sidewalls of the lower electrode 14, the intermetallic compound layer 19, and the upper electrode 24 to protect the lower electrode 14, the intermetallic compound layer 19, and the upper electrode 24. The protective layer 15 may be cured by the conductive heat.

The lower substrate 12, the lower electrode 14, the upper electrode 24, the solder bump layer 26, and the pressing member 30 may be configured in the same manner as in FIGS. 3 and 4.

Figure 7:
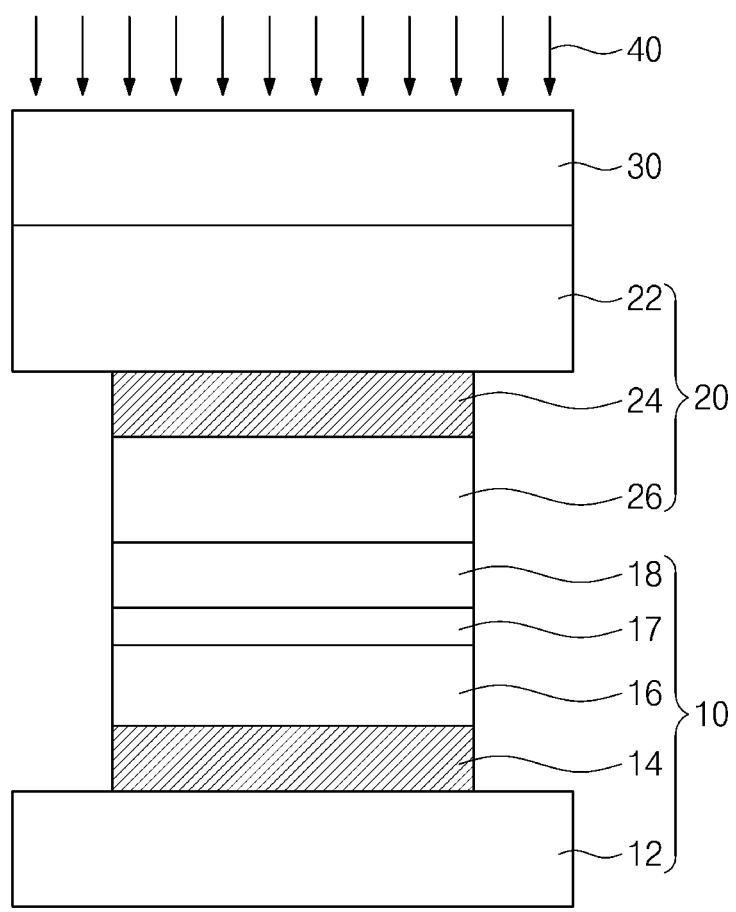
FIG. 7 is a process cross-sectional view illustrating an example in the method of fabricating the semiconductor package according to the inventive concept.
Figure 8A:
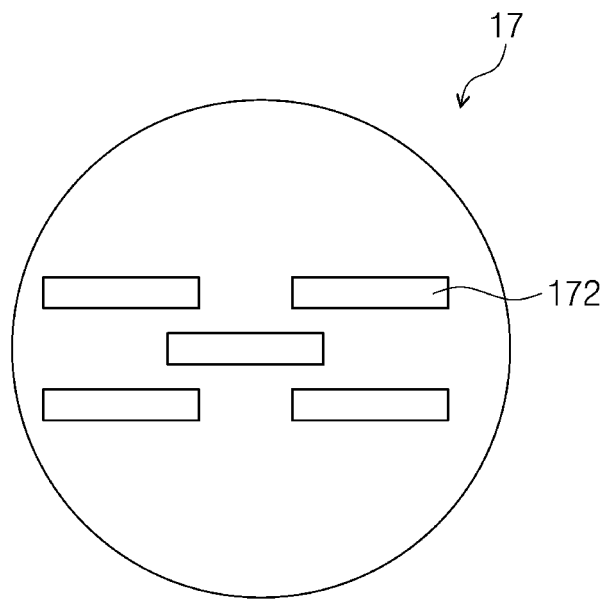
FIGS. 8A and 8B are views illustrating plate-shaped absorbers and metal powder within an absorber layer of FIG. 7.
Figure 8B:
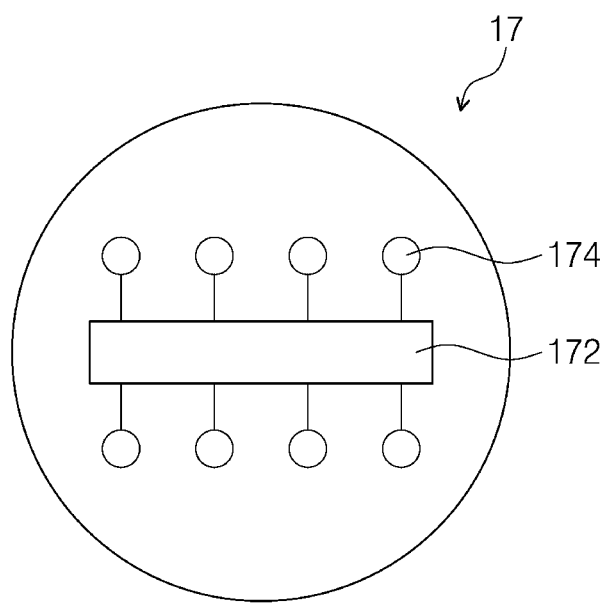

FIG. 7 is a process cross-sectional view illustrating an example in the method of fabricating the semiconductor package according to the inventive concept. FIGS. 8A and 8B illustrate plate-shaped absorbers 172 and metal powder 174 within an absorber layer 17 of FIG. 7.

Referring to FIG. 7, the lower element 10 may further include the absorber layer 17. The absorber layer 17 may be provided between the UBM layer 16 and the reducing agent layer 18. The absorber layer 17 may allow absorption of the conducted heat and/or the radiant heat of the laser beam 40 to increase. The absorber layer 17 may include a carbon component and metal powder. When the laser beam 40 is irradiated, the UBM layer 16, the absorber layer 17, the reducing agent layer 18, and the solder bump layer 26 may be formed as the intermetallic compound layer 19 of FIG. 4. The lower substrate 12, the upper substrate 22, the upper electrode 24, the solder bump layer 26, and the pressing member 30 may be configured in the same manner as in FIG. 3.

Referring to FIG. 8A, the absorber layer 17 may include the plate-shaped absorber 172. The plate-shaped absorber 172 may include carbon black, carbon nanotubes (CNT), and graphene.

Referring to FIG. 8B, the absorber layer 17 may further include the metal powder 174 coupled to the plate-shaped absorber 172. The metal powder 174 may be ionically coupled to the plate-shaped absorber 172. The metal powder 174 may include nickel (Ni) or copper (Cu), but the present disclosure is not limited thereto.

Figure 9:
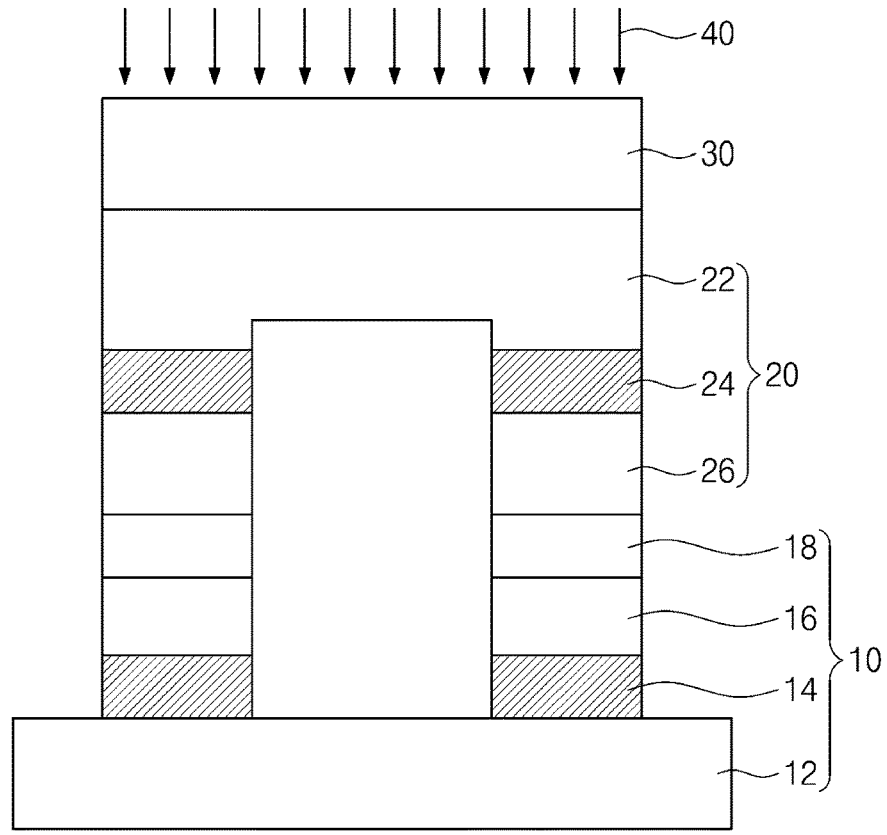
FIGS. 9 and 10 are process cross-sectional views illustrating examples in the method of fabricating the semiconductor package according to the inventive concept.
Figure 10:
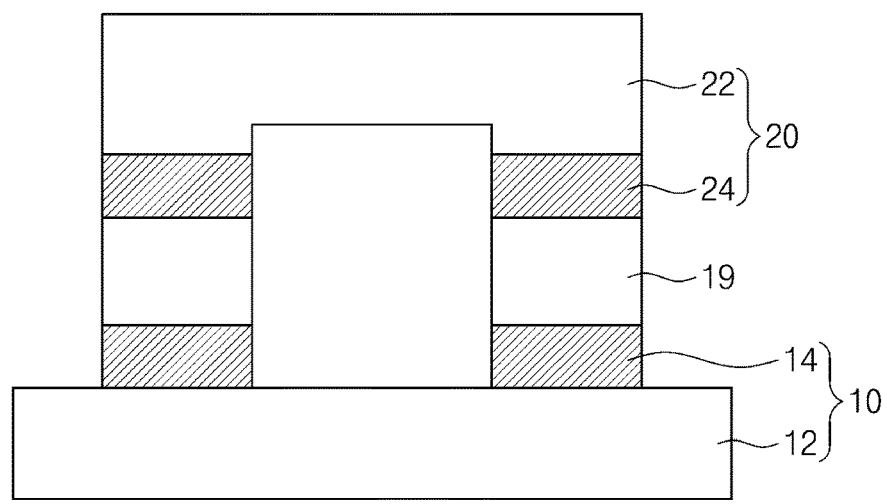

FIGS. 9 and 10 are process cross-sectional views illustrating examples in the method of fabricating the semiconductor package according to the inventive concept.

Referring to FIGS. 9 and 10, the semiconductor package according to the inventive concept may include a MEMS/sensor package. The lower element 10 may be a MEMS/sensor element, and the upper element 20 may be a lead.

The lower substrate 12 may include silicon, a compound semiconductor, aluminum nitride (AlN), alumina, ceramic, or a printed circuit board, but the present disclosure is not limited thereto. The plurality of lower electrodes 14 may be provided on edges of the lower substrate 12. The UBM layer 16 may be provided on the lower electrodes 14, and the reducing agent layer 18 may be provided on the UBM layer 16. The solder bump layer 26 may be provided on the reducing agent layer 18, and the upper electrodes 24 may be provided on the solder bump layer 26. For example, materials of the UBM layer 16 and the solder bump layer 26 may be exchanged with each other. For example, the UBM layer 16 may include solders of tin (Sn), indium (In), tin bismuth (SnBi), tin silver copper (SnAgCu), tin silver (SnAg), gold tin (AuSn), indium tin (InSn), and bismuth indium tin (BiInSn). The solder bump layer 26 may include chromium (Cr), copper (Cu), and an alloy of chromium-copper (Cr—Cu). The upper substrate 22 may be provided on the upper electrodes 24.

The pressing member 30 and the upper substrate 22 may transmit the laser beam 40. The upper substrate 22 may include glass or silicon. The laser beam 40 may not be absorbed to the upper substrate 22, and the laser beam 40 may selectively heat the solder bump layer 26, the reducing agent layer 18, and the UBM layer 16 to minimize thermal stress of the intermetallic compound layer 19, thereby improving mechanical reliability.

Figure 11:
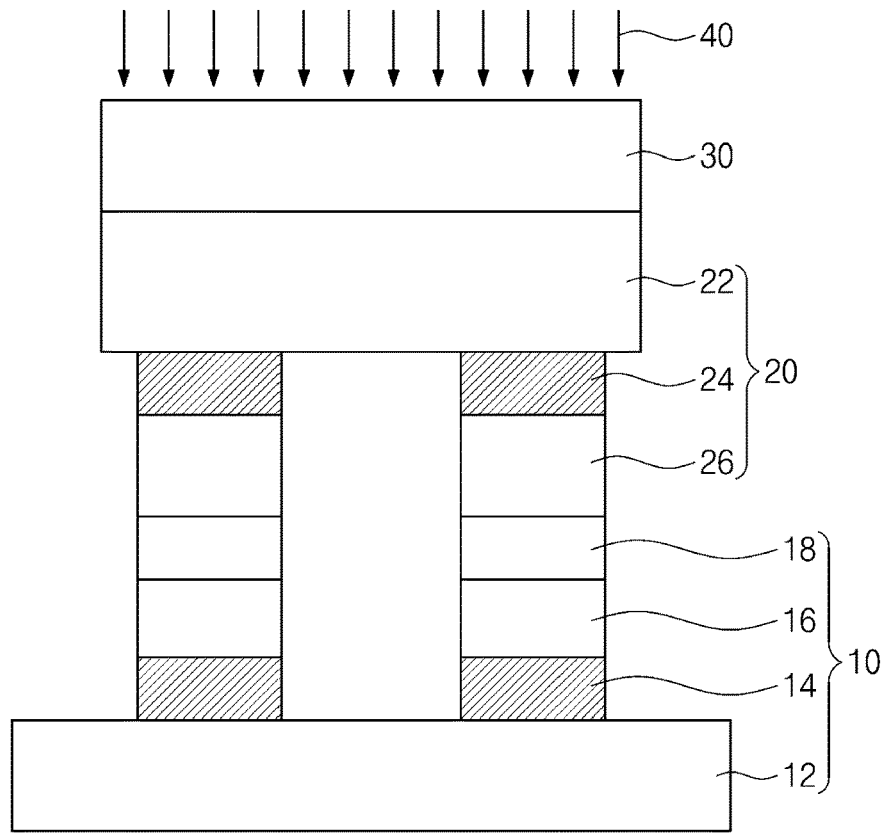
FIGS. 11 and 12 are process cross-sectional views illustrating examples in the method of fabricating the semiconductor package according to the inventive concept.
Figure 12:
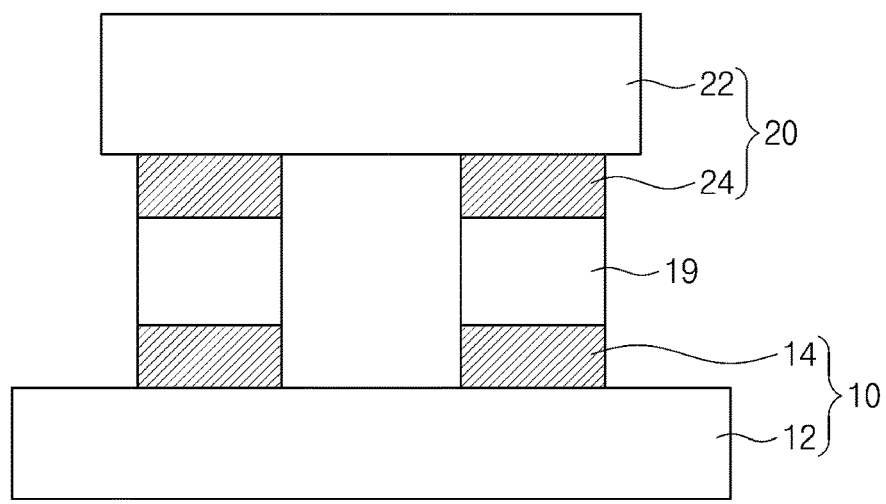

FIGS. 11 and 12 are process cross-sectional views illustrating examples in the method of fabricating the semiconductor package according to the inventive concept.

Referring to FIGS. 11 and 12, the upper substrate 22 may be a light emitting element (LED). In addition, the upper substrate 22 may be a micro light emitting element or a nano light emitting element, but the present disclosure is not limited thereto. The UBM layer 16 may include an alloy of Ni/Au. The solder bump layer 26 may include a solder including at least one of tin (Sn), indium (In), or zinc (Zn).

The lower substrate 12, the lower electrode 14, the UBM layer 16, the reducing agent layer 18, the intermetallic compound layer 19, the upper substrate 22, the upper electrode 24, the solder bump layer 26), the pressing member 30, and the laser beam 40 may be configured in the same manner as in FIGS. 3 and 4.

Figure 13:
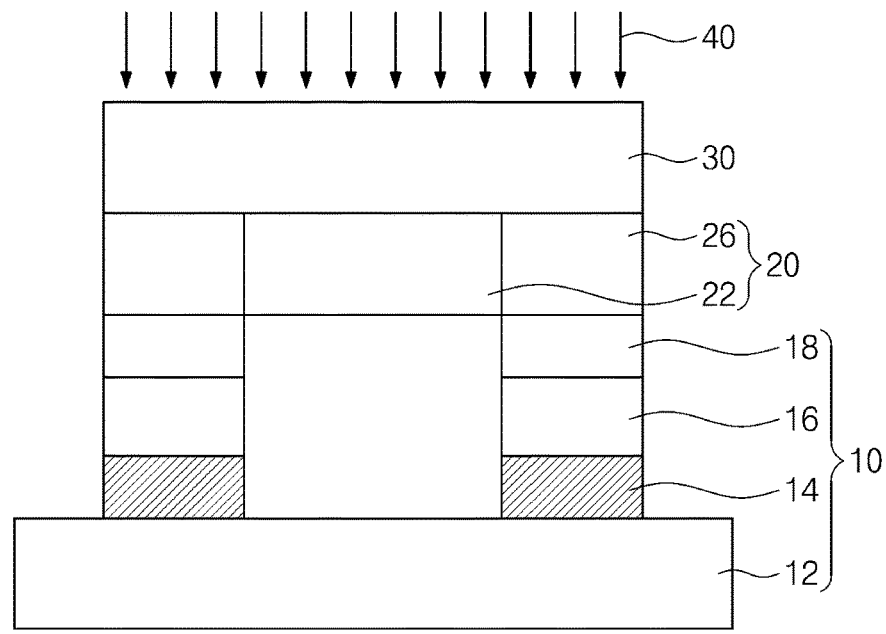
FIG. 13 is a process cross-sectional view illustrating an example in the method of fabricating the semiconductor package according to the inventive concept.

FIG. 13 is a process cross-sectional view illustrating an example in the method of fabricating the semiconductor package according to the inventive concept.

Referring to FIG. 13, the upper substrate 22 of the upper element 20 may be a rod-shaped light emitting element. The solder bump layer 26 may be provided on sidewalls of the upper substrate 22, which face each other. Although not shown, the upper electrode may be provided on each of both the sidewalls of the upper element 20. Alternatively, the upper electrode may be provided between each of both the sidewalls of the upper substrate 22 and the solder bump layer 26, but the present disclosure is not limited thereto. The laser beam 40 may heat the solder bump layer 26, the reducing agent layer 18, and the UBM layer 16 to form the intermetallic compound layer 19 (see FIG. 4).

The lower electrodes 14 may include ITO, IZO, or aluminum. The UBM layer 16 may include at least one of nickel (Ni), copper (Cu), gold (Au), silver (Ag), platinum (Pt), or palladium (Pd). The solder bump layer 26 may include at least one solder of tin (Sn), indium (In), or zinc (Zn). Alternatively, the materials of the UBM layer 16 and the solder bump layer 26 may be exchanged with each other, but the present disclosure is not limited thereto.

The lower substrate 12, the reducing agent layer 18, the intermetallic compound layer 19, the upper electrode 24, the pressing member 30, and the laser beam 40 may be configured in the same manner as in FIGS. 3 and 4.

Figure 14:
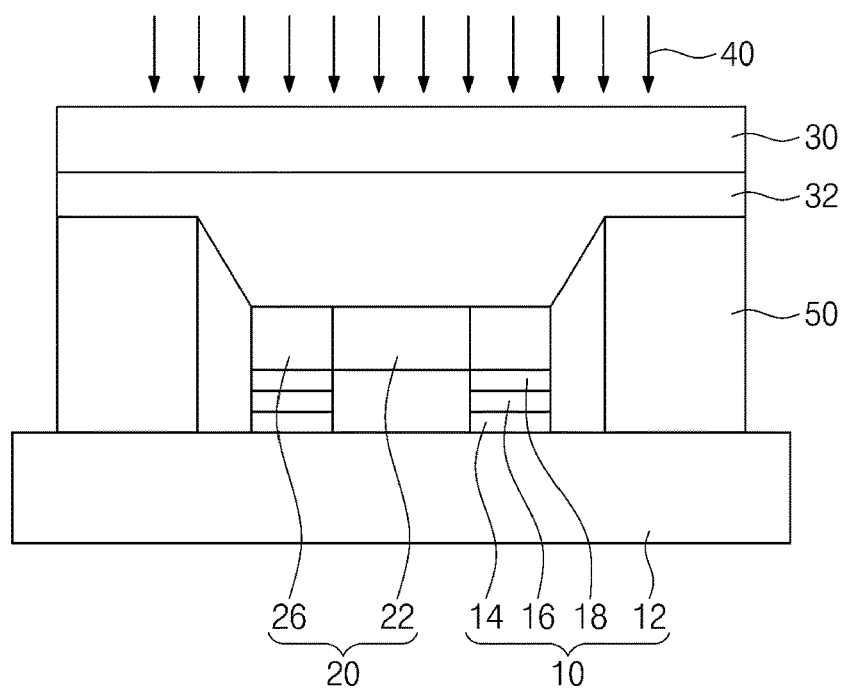
FIG. 14 is a process cross-sectional view illustrating an example in the method of fabricating the semiconductor package according to the inventive concept.

FIG. 14 is a process cross-sectional view illustrating an example in the method of fabricating the semiconductor package according to the inventive concept.

Referring to FIG. 14, the lower substrate 12 of the lower element 10 may have partition walls 50. The partition walls 50 may be provided outside the upper element 20. The upper element 20 may be provided between the partition walls 50. The partition walls 50 may include at least one polymer of polymethylmethacrylate (PMMA), polycarbonate, or polyimide. The partition walls 50 may be formed by the laser beam 40. Each of the partition walls 50 may be a rise region of the lower substrate 12 outside the upper element 20. Each of the partition walls 50 may have a height less than that of the upper element 20. A polymer film 32 may be provided between each of the partition walls 50 and the pressing member 30 and between the upper substrate 22 and the pressing member 30. The polymer film 32 may be transparent. The polymer film 32 may transmit the laser beam 40 to the solder bump layer 26. The polymer film 32 may have a shape that is convex in a downward direction. The polymer film 32 may press the solder bump layer 26 to the reducing agent layer 18 and the UBM layer 16. The polymer film 32 may include any one of polymethylmethacrylate (PMMA), polycarbonate, and polyimide.

The lower electrode 14, the UBM layer 16, and the reducing agent layer 18 of the lower element 10 may be configured in the same manner as in FIG. 11.

Figure 15:
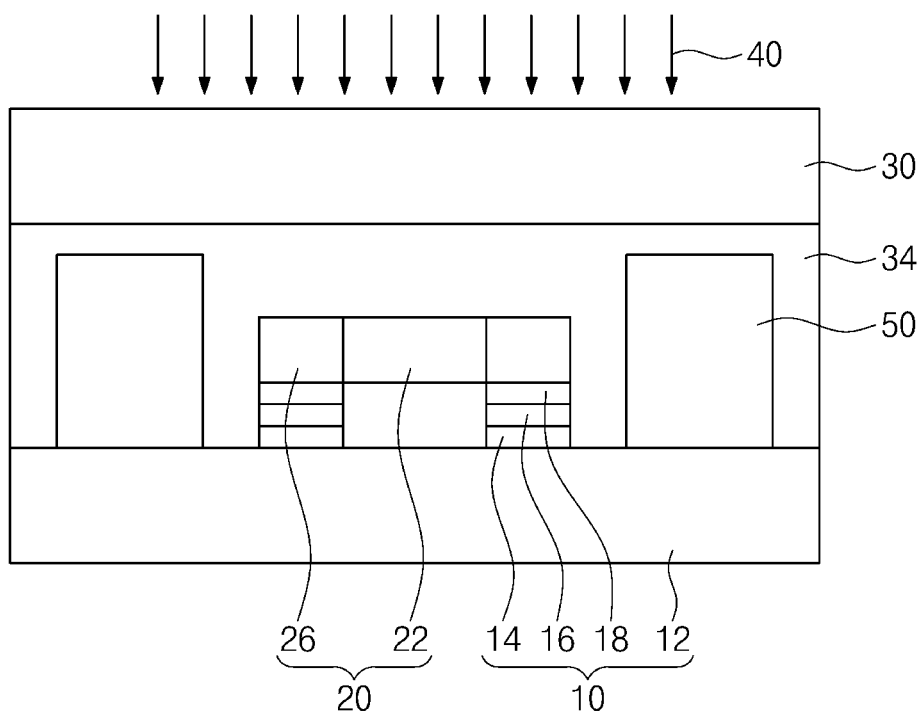
FIG. 15 is a process cross-sectional view illustrating an example in the method of fabricating the semiconductor package according to the inventive concept.

FIG. 15 is a process cross-sectional view illustrating an example in the method of fabricating the semiconductor package according to the inventive concept.

Referring to FIG. 15, the upper substrate 22 may be bonded to the lower element 10 by using an elastic member 34 between the pressing member 30 and each of the partition walls 50 and between the pressing member 30 and the upper substrate 22. The elastic member 34 may prevent the pressing member 30 and the partition walls 50 from colliding with each other and may press the upper substrate 22 to the lower element 10. The elastic member 34 may be transparent. For example, the elastic member 34 may include PDMS, silicon, or silica.

The lower element 10 and the upper element 20 may be configured in the same manner as in FIGS. 13 and 14.

Figure 16:
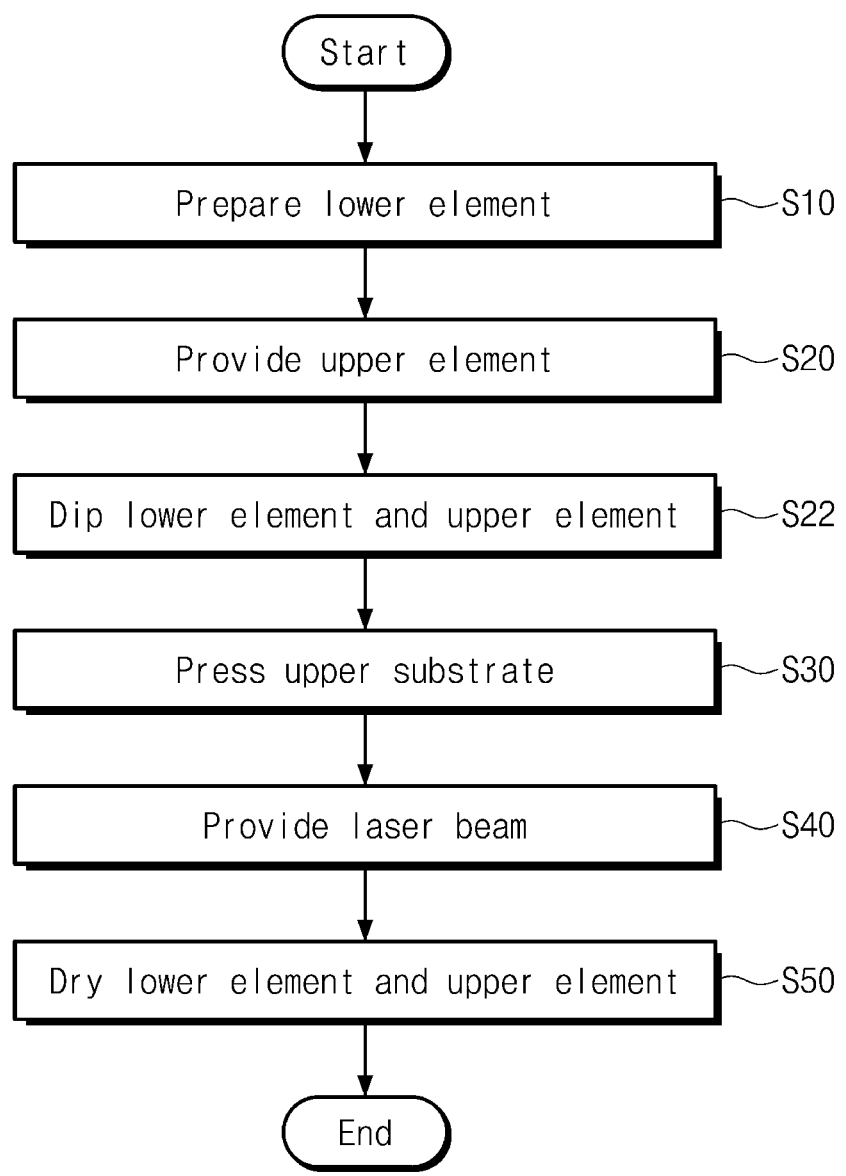
FIG. 16 is a flowchart illustrating the method of fabricating the semiconductor package according to the inventive concept.
Figure 17:
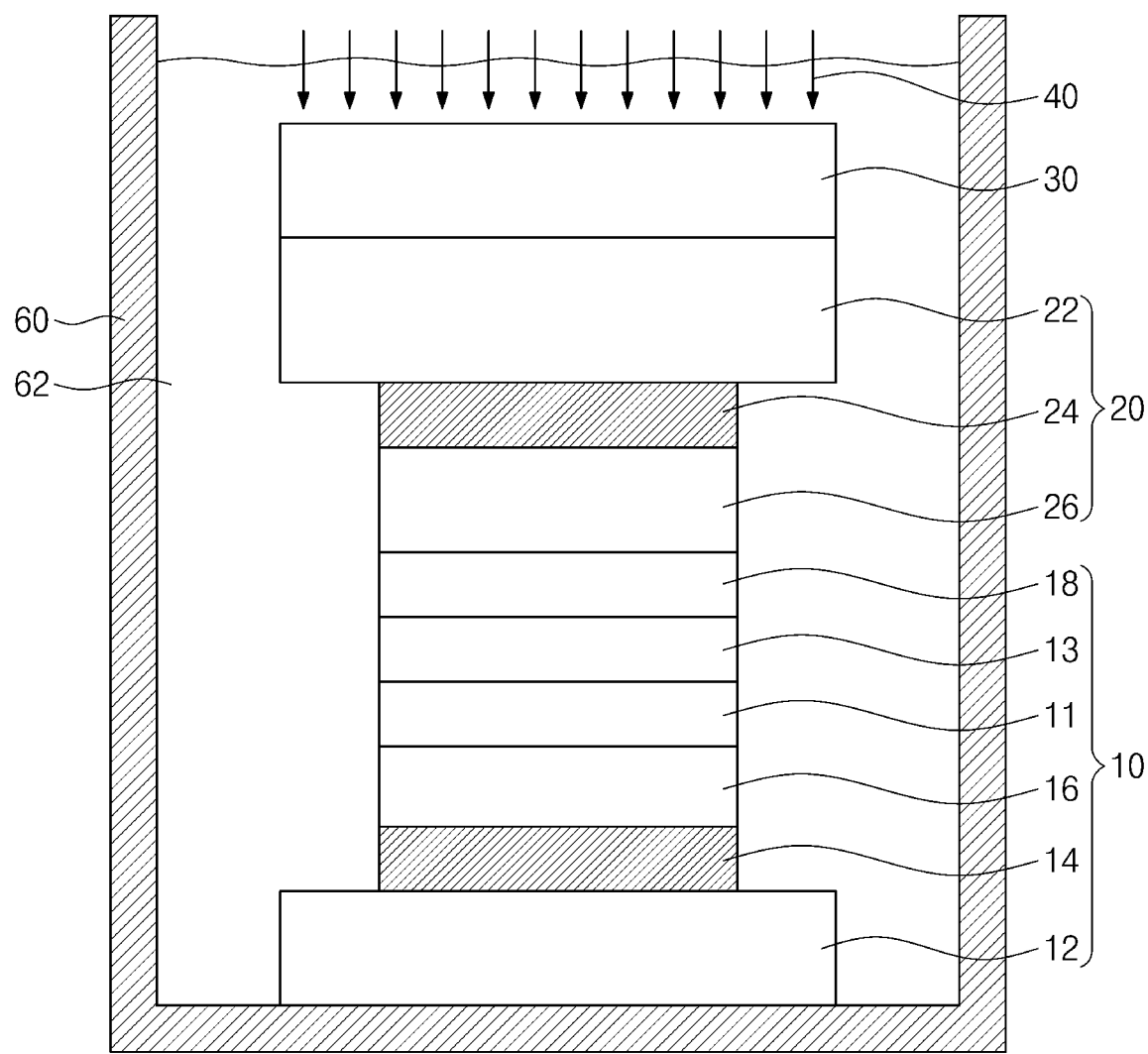
FIGS. 17 and 18 are process cross-sectional views illustrating the method of fabricating the semiconductor package of FIG. 16.
Figure 18:
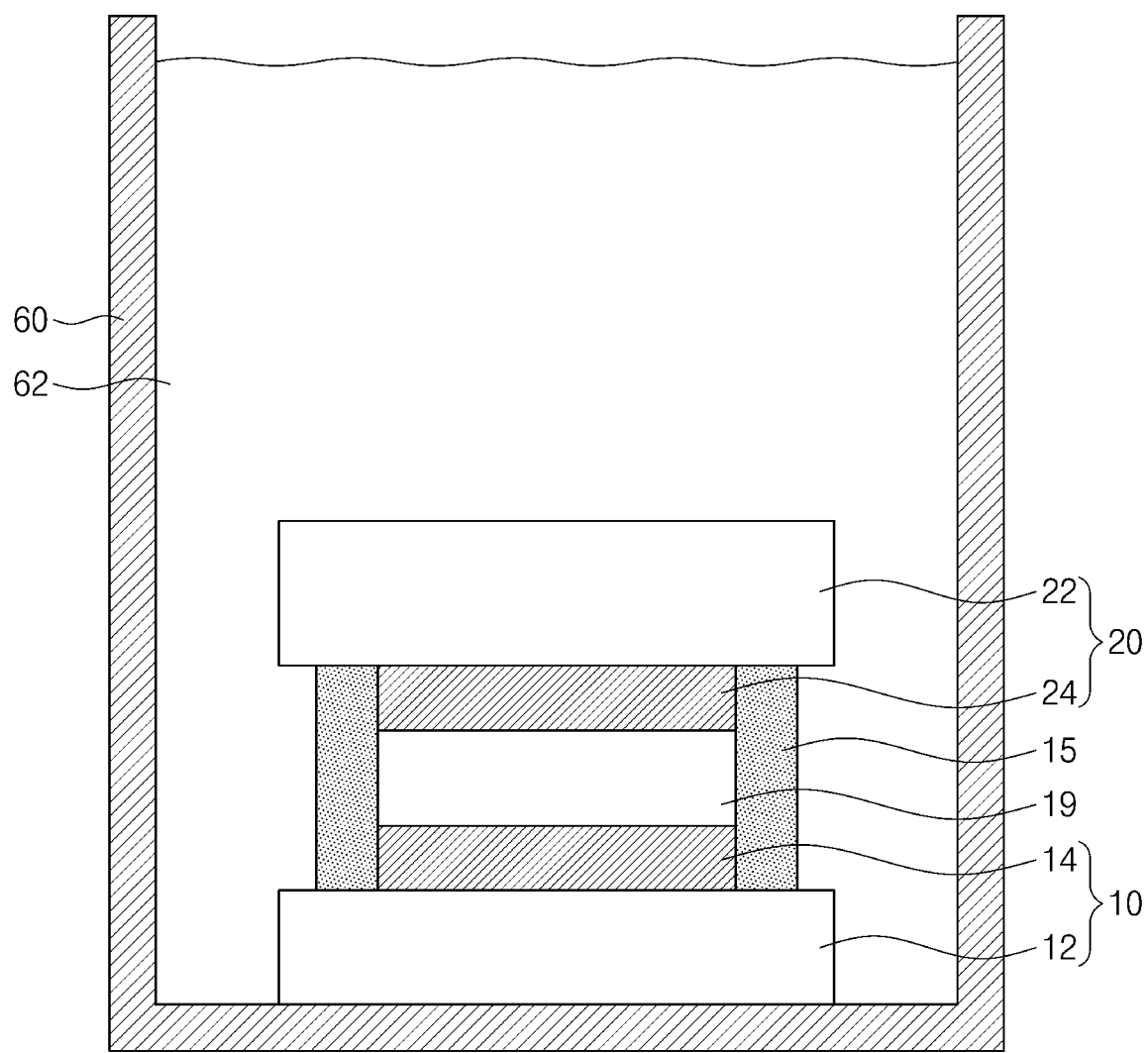

FIG. 16 is a view illustrating the method of fabricating the semiconductor package according to the inventive concept. FIGS. 17 and 18 are process cross-sectional views illustrating the method of fabricating the semiconductor package of FIG. 16.

Referring to FIGS. 16 and 17, the lower element 10 and the upper element 20 are dipped in DI (deionized) water 62 (S22). Before this, a process (S10) of preparing the lower element 10 and a process (S20) of providing the upper element 20 may be configured in the same manner as in FIG. 1. The DI water 62 may be stored in a bath 60. Alternatively, the DI water 62 may be provided between the lower element 10 and the upper element 20 by a nozzle (not shown), but the present disclosure is not limited thereto.

Next, the pressing member 30 is provided on the upper substrate 22 of the upper element 20 to press the upper substrate 22 (S30). The pressing member 30 may be provided in the DI water 62. The pressing member 30 may press the upper substrate 22.

Next, the laser beam 40 is provided to the upper element 20 and the lower element 10 to bond the upper element 20 to the lower element 10 (S40). The laser beam 40 may be provided to the upper element 20 by passing through the DI water 62 and the pressing member 30. The laser beam 40 may heat the upper substrate 22 and/or the upper electrode 24 of the upper element 20 to bond the upper element 20 to the lower element 10. The laser beam 40 may be transmitted through the upper substrate 22 and absorbed to the upper electrode 24.

Referring to FIG. 18, the upper electrode 24 may form the solder bump layer 26, the reducing agent layer 18, and the UBM layer 16 as the intermetallic compound layer 19 using the conductive heat. The intermetallic compound layer 19 may bond and/or connect the upper electrode 24 to the lower electrode 14.

The curing agent layer 11 and the base material layer 13 of the lower element 10 may be formed as the protective layer 15 around the intermetallic compound layer 19. The DI water 62 may allow the protective layer 15 to be formed around the lower electrode 14 and the upper electrode 24. The protective layer 15 may be in close contact with the sidewalls of the intermetallic compound layer 19, the lower electrode 14, and the upper electrode 24 by surface tension of the DI water 62. That is, the DI water 62 may uniformly apply the protective layer 15 to the sidewalls of the intermetallic compound layer 19, the lower electrode 14, and the upper electrode 24.

Then, the DI water 62 is removed to dry the lower element 10 and the upper element 20 (S50). For example, the DI water 62 may be removed by heat wind. Also, the DI water 62 may be removed by an organic solvent or may be removed by a supercritical fluid, but the present disclosure is not limited thereto.

Figure 19:
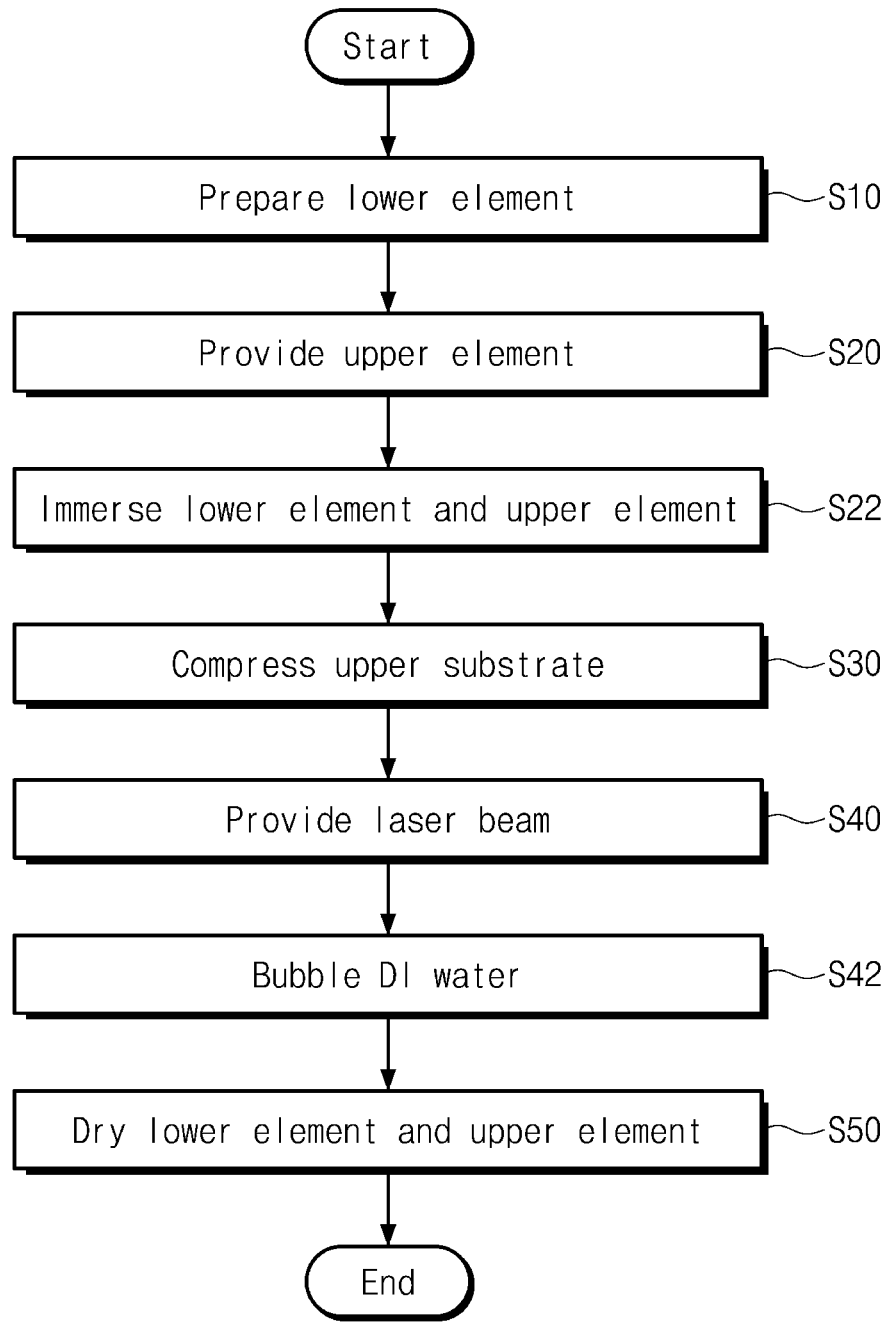
FIG. 19 is a flowchart illustrating the method of fabricating the semiconductor package according to the inventive concept.

FIG. 19 is a view illustrating the method of fabricating the semiconductor package according to the inventive concept.

Figure 20:
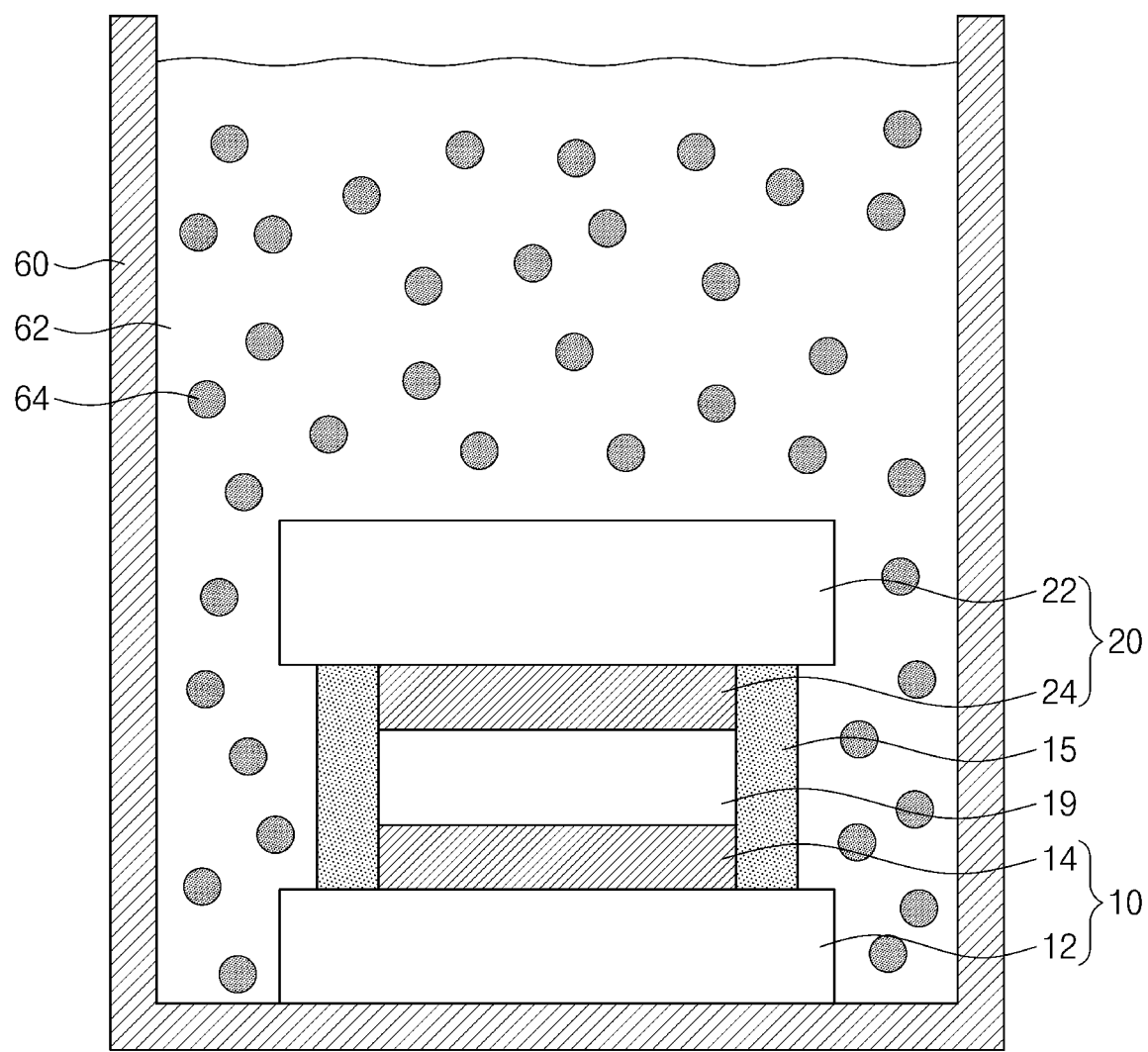
FIG. 20 is a process cross-sectional view illustrating the method of fabricating the semiconductor package according to the inventive concept.

FIG. 20 is a process cross-sectional view illustrating the method of fabricating the semiconductor package according to the inventive concept.

Referring to FIGS. 19 and 20, the method of fabricating the semiconductor package according to the inventive concept may further include a process (S42) of bubbling the DI water 62. The process (S42) of bubbling the DI water 62 may include a process of heating the DI water 62 to a boiling point. Alternatively, the process (S42) of bubbling the DI water 62 may include a process of providing a nitrogen gas in the DI water 62, but the present disclosure is not limited thereto. The DI water 62 may have bubbles 64. The bubbles 64 may thermally stabilize the intermetallic compound layer 19 and the protective layer 15 to reduce the thermal stress.

The process (S10) of preparing the lower element 10, the process (S20) of providing the upper element 20, the process (S22) of dipping the lower element 10 and the upper element 20, the process (S30) of pressing the upper substrate 22, the process (S40) of providing the laser beam 40, and the process (S50) of drying the lower element 10 and the upper element 20 may be configured as the same manner as in FIG. 16.

In the method of fabricating the semiconductor package according to the inventive concept, the UBM layer and the solder bump layer may be formed as the intermetallic compound layer using the conductive heat of the upper substrate and the lower substrate, which are exposed to the laser beam, to minimize the thermal stress due to the difference in thermal expansion coefficient between the lower element and the upper element.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A method of fabricating a semiconductor package, the method comprising:
   preparing a lower element including a lower substrate, a lower electrode on the lower substrate, an under bump metallurgy (UBM) layer on the lower electrode, and a reducing agent layer on the UBM layer;
   providing an upper element including an upper substrate, an upper electrode on the upper substrate, and a solder bump layer on the upper electrode;
   providing a pressing member on the upper substrate to press the upper substrate to the lower substrate; and
   providing a laser beam passing through the pressing member to the upper substrate to form the UBM layer, the reducing agent layer, and the solder bump layer as an intermetallic compound layer by using a conductive heat of the upper substrate and the upper electrode.

2. The method of claim 1, wherein the UBM layer comprises nickel, copper, and an alloy of nickel-copper.

3. The method of claim 1, wherein the reducing agent layer comprises hydrates of carboxylic hydrate, hydroxyl hydrate, and phenolic hydrate.

4. The method of claim 1, wherein the solder bump layer comprises solders of tin (Sn), indium (In), tin bismuth (SnBi), tin silver copper (SnAgCu), tin silver (SnAg), gold tin (AuSn), indium tin (InSn), and bismuth indium tin (BiInSn).

5. The method of claim 1, wherein the lower substrate comprises a light emitting element, and
   the upper substrate includes a lead.

6. The method of claim 1, wherein the lower element further comprises an absorption layer between the UBM layer and the reducing agent layer.

7. The method of claim 6, wherein the absorption layer comprises:
   a plate-shaped absorber; and
   metal powder bonded to the plate-shaped absorber.

8. The method of claim 7, wherein the plate-shaped absorber comprises graphene.

9. The method of claim 7, wherein the metal powder comprises nickel or copper.

10. The method of claim 1, wherein the lower substrate further comprises partition walls outside the upper element.

11. The method of claim 10, further comprising providing an elastic member between the pressing member and each of the partition walls and between the pressing member and the upper substrate,
    wherein the elastic member comprises polydimethylsiloxane (PDMS), silicon, or silica.

12. The method of claim 10, further comprising providing a polymer film between the pressing member and each of the partition walls and between the pressing member and the upper substrate.

13. The method of claim 12, wherein the polymer film is transparent and has a convex shape in a downward direction.

14. The method of claim 12, wherein the polymer film comprises polymethylmethacrylate (PMMA), polycarbonate, or polyimide.

15. The method of claim 1, wherein the lower element further comprises:
    a curing agent layer between the UBM layer and the reducing agent layer; and
    a base material layer between the curing agent layer and the reducing agent layer.

16. The method of claim 15, wherein the curing agent layer comprises aliphatic amine, and
    the base material layer includes epoxy.

17. The method of claim 15, wherein the curing agent layer and the base material layer are formed as a protective layer around the intermetallic compound layer.

18. The method of claim 17, further comprising dipping the lower element and the upper element in DI (deionized) water through which the laser beam is transmitted,
    wherein the DI water allows the protective layer to be formed around the lower electrode and the upper electrode.

19. The method of claim 18, further comprising bubbling the DI water.

20. The method of claim 18, further comprising removing the DI water to dry the lower element and the upper element.

* * * * *